United States Patent
Hsiao et al.

(10) Patent No.: US 10,312,379 B2
(45) Date of Patent: Jun. 4, 2019

(54) HIGH VOLTAGE DEVICE

(71) Applicant: UNITED MICROELECTRONICS CORP., Hsin-Chu (TW)

(72) Inventors: Shih-Yin Hsiao, Chiayi County (TW); Kai-Kuen Chang, Keelung (TW); Ching-Chung Yang, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 30 days.

(21) Appl. No.: 15/660,982

(22) Filed: Jul. 27, 2017

(65) Prior Publication Data
US 2019/0006528 A1   Jan. 3, 2019

(30) Foreign Application Priority Data

Jun. 28, 2017   (CN) .......................... 2017 1 0505678

(51) Int. Cl.
*H01L 29/06* (2006.01)
*H01L 29/872* (2006.01)
*H01L 29/40* (2006.01)

(52) U.S. Cl.
CPC ........ *H01L 29/872* (2013.01); *H01L 29/0649* (2013.01); *H01L 29/0692* (2013.01); *H01L 29/402* (2013.01)

(58) Field of Classification Search
CPC ........... H01L 29/66143; H01L 29/6612; H01L 29/872; H01L 51/0579; H01L 2924/12032; H01L 29/0649; H01L 29/0692; H01L 29/402
See application file for complete search history.

(56) References Cited

U.S. PATENT DOCUMENTS

| | | | |
|---|---|---|---|
| 2008/0135970 A1 | 6/2008 | Kim | |
| 2012/0068297 A1 | 3/2012 | Tsai | |
| 2015/0255595 A1* | 9/2015 | Hebert | .............. H01L 29/66598 257/344 |

* cited by examiner

*Primary Examiner* — Nathan W Ha
(74) *Attorney, Agent, or Firm* — Winston Hsu

(57) ABSTRACT

A high voltage device includes a semiconductor substrate, an ion well, a Schottky diode in the ion well, an isolation structure in the ion well surrounding the Schottky diode, and an assistant gate surrounding the Schottky diode. The assistant gate is disposed only on the isolation structure and is not in direct contact with the ion well.

18 Claims, 2 Drawing Sheets

US 10,312,379 B2

HIGH VOLTAGE DEVICE

CROSS REFERENCE TO RELATED APPLICATION

This application claims the priority from CN application No. 201710505678.9, filed Jun. 28, 2017, which is included in its entirety herein by reference.

BACKGROUND OF THE INVENTION

1. Field of the Invention

The present invention relates to the technical field of a semiconductor device, and more particularly to an improved semiconductor high voltage device capable of improving the breakdown voltage.

2. Description of the Prior Art

It is known that Schottky diodes are commonly used in electronic circuits that require fast switching, such as power circuits. As the Schottky diode has a higher current density, it is suitable for voltage clamping and to prevent the transistor saturation.

However, the disadvantage of the Schottky diode is its low breakdown voltage (BVD). Therefore, how to improve the breakdown voltage characteristics of the Schottky diode without affecting the forward current and device pitch has become the main research topic in this field.

SUMMARY OF THE INVENTION

It is a primary object of the present invention to provide an improved high voltage device having an assistant gate electrically connected to a Schottky diode of the high voltage device so as to improve the breakdown voltage characteristic of the high voltage device.

One embodiment of the invention discloses a high voltage device including a semiconductor substrate having a first conductivity type, a first ion well having a second conductivity type, a Schottky diode disposed in the first ion well, an isolation structure in the first ion well and surrounding the Schottky diode, and an assistant gate disposed only on the isolation structure and surrounding the Schottky diode. The assistant gate is electrically connected to the Schottky diode.

When the high voltage element is operated in the reverse mode, for example, the Schottky diode and the assistant gate are applied with a negative voltage. The assistant gate provided on the isolation structure capacitively couples with the first ion well directly below the isolation structure and an extended depletion region is generated, thereby achieving the purpose of increasing the breakdown voltage of the high voltage device.

Another embodiment of the invention discloses a layout structure of a high voltage device including a semiconductor substrate having a first conductivity type, a first ion well having a second conductivity type, a Schottky diode disposed in the first ion well, an annular isolation structure in the first ion well and surrounding the Schottky diode, and an assistant gate disposed only on the isolation structure and surrounding the Schottky diode. The annular assistant gate is electrically connected to the Schottky diode.

The layout structure of a high voltage device further includes an annular second ion well having the first conductivity type in the first ion well. The annular second ion well is disposed along an inner side of the annular isolation structure and surrounds the Schottky diode. The annular second ion well overlaps with an inner portion of the isolation structure.

The isolation structure further comprises an outer portion. The annular assistant gate is disposed on the outer portion. The outer portion of the isolation structure has a thickness that is smaller than that of the inner portion of the isolation structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
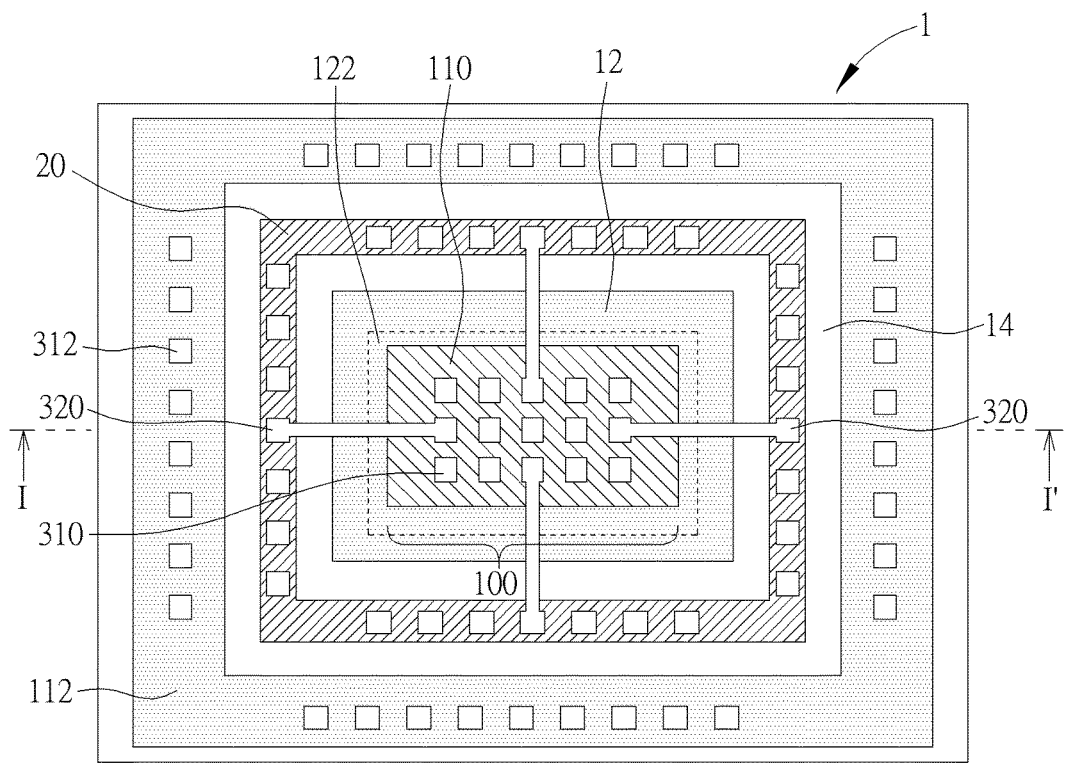
FIG. 1 is an exemplary layout of a high voltage device in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Figure 2:
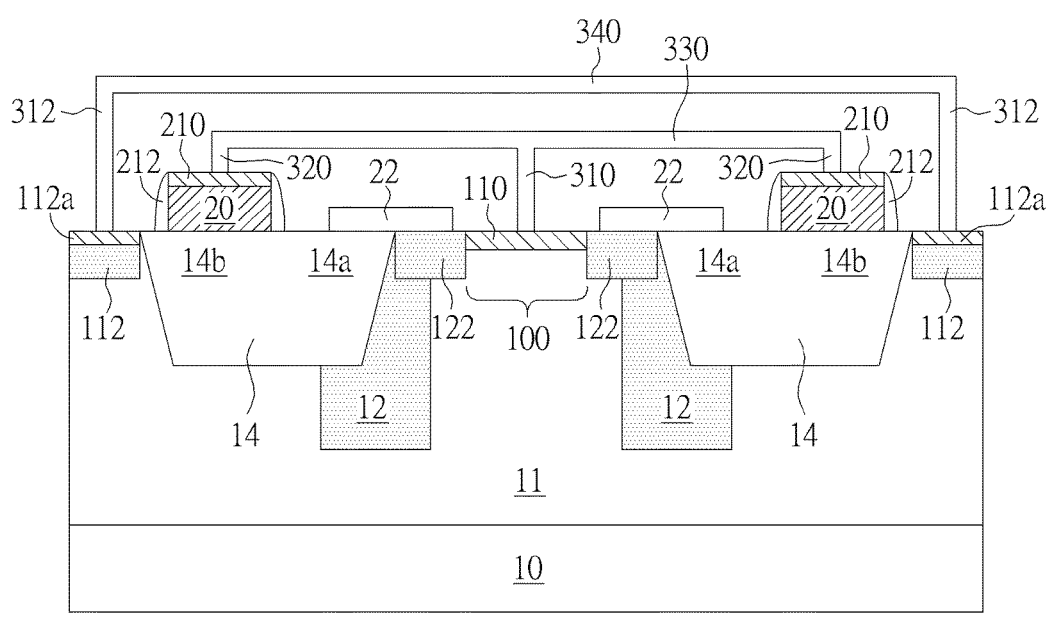
FIG. 2 is a schematic, cross-sectional view taken along line I-I' in FIG. 1.

First, please refer to FIG. 1 and FIG. 2. FIG. 1 is an exemplary layout of a high voltage device in accordance with one embodiment of the invention. FIG. 2 is a schematic, cross-sectional view taken along line I-I' in FIG. 1.

As shown in FIG. 1 and FIG. 2, the high voltage device 1 comprises a semiconductor substrate 10 having a first conductivity type, a first ion well 11 having a second conductivity type, a Schottky diode 100 disposed in the first ion well 11, an annular isolation structure 14 disposed in the first ion well 11 and surrounding the Schottky diode 100, and an annular assistant gate 20 surrounding the Schottky diode 100. According to one embodiment of the invention, the assistant gate 20 is disposed only on the isolation structure 14 and is not in direct contact with the first ion well 11.

According to one embodiment of the invention, for example, the first conductivity type is P type and the second conductivity type is N type. According to one embodiment of the invention, for example, the first ion well 11 is a deep N well. According to one embodiment of the invention, the semiconductor substrate 10 may comprise a silicon substrate, an epitaxial semiconductor substrate or a silicon-on-insulator (SOI) substrate, but is not limited thereto.

According to one embodiment of the invention, the isolation structure 14 is a continuous and annular shallow trench isolation (STI) structure, which encircles the Schottky diode 100.

According to one embodiment of the invention, the Schottky diode 100 comprises a silicide layer 110 that is in direct contact with the first ion well 11, and acts as a drain or an anode of the high voltage device 1. According to one embodiment of the invention, for example, the silicide layer 110 may comprise cobalt silicide or nickel silicide, but is not limited thereto.

According to one embodiment of the invention, the high voltage device 1 further comprises an annular second ion well 12 having the first conductivity type and is disposed within the first ion well 11. The second well 12 is disposed along an inner side of the isolation structure 14 and surrounds the Schottky diode 100. The second well 12 overlaps with an inner portion 14a of the isolation structure 14. According to one embodiment of the invention, the second well 12 is a P well.

According to one embodiment of the invention, the high voltage device 1 further comprises an annular salicide block (SAB) layer 22 on the second ion well 12. The SAB layer 22 surrounds the Schottky diode 100 and extends to above the inner portion 14a of the isolation structure 14.

According to one embodiment of the invention, the assistant gate 20 is not in direct contact with the SAB layer 22 and is kept a distance such as 0.6 to 1.0 micrometers, preferably 0.8 micrometers, from the SAB layer 22. According to one embodiment of the invention, the SAB layer 22 is disposed at an interface between the isolation structure 14 and the second ion well 12 such that the SAB layer 22 partially overlaps with the second ion well 12 and that the silicide layer 110 is not in direct contact with the isolation structure 14.

According to one embodiment of the invention, the assistant gate 20 may comprise polysilicon, but is not limited thereto. According to one embodiment of the invention, a silicide layer 210 is disposed on the assistant gate 20. A spacer 212 may be disposed on each sidewall of the assistant gate 20.

According to one embodiment of the invention, the high voltage device 1 may further comprise an annular first heavily doped region 122 having first conductivity type. Part of the first heavily doped region 122 may be formed within the second ion well 12 and part of the first heavily doped region 122 may be formed within the first ion well 11. The first heavily doped region 122 encircles the Schottky diode 100. According to one embodiment of the invention, the first heavily doped region 122 may be a P+ doped region.

According to one embodiment of the invention, the first heavily doped region 122 may be disposed between the Schottky diode 100 and the isolation structure 14. According to one embodiment of the invention, the first heavily doped region 122 may disposed directly under the SAB layer 22.

According to another embodiment of the invention, the first heavily doped region 122 may be omitted.

According to one embodiment of the invention, the high voltage device 1 further comprises an annular second heavily doped region 112 having the second conductivity type. The second heavily doped region 112 is disposed within the first ion well 11 and extends along an outer perimeter of the isolation structure 14. The second heavily doped region 112 encircles an outer portion 14b of the isolation structure 14. According to another embodiment of the invention, the second heavily doped region 112 may be an N+ doped region. According to one embodiment of the invention, the second heavily doped region 112 may acts as a source or a cathode of the high voltage device 1.

According to one embodiment of the invention, a silicide layer 112a may be disposed on the second heavily doped region 112. According to one embodiment of the invention, the second heavily doped region 112 may be electrically connected to an interconnection 340 via the contact element 312.

According to one embodiment of the invention, the assistant gate 20 may be electrically connected to the silicide layer 110 of the Schottky diode 100 through the contact element 310, interconnection 330, and contact element 320, such that in operation the assistant gate 20 and the drain of the Schottky diode 100 are operated at the same voltage.

When the high voltage element 1 is operated in the reverse mode, for example, the silicide layer 110 of the Schottky diode 100 and the assistant gate 20 are applied with a negative voltage. The assistant gate 20 provided on the outer portion 14b of the isolation structure 14 capacitively couples with the first ion well 11 directly below the outer portion 14b and an extended depletion region is generated, thereby achieving the purpose of increasing the breakdown voltage of the high voltage device 1.

Figure 3:
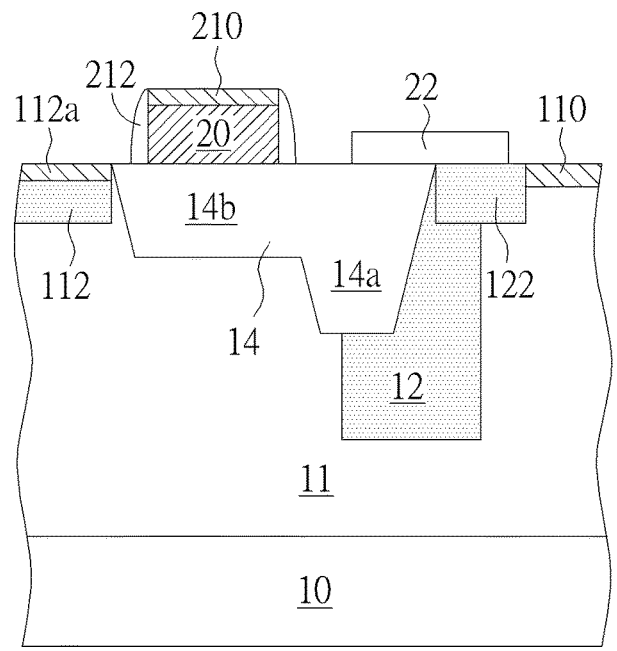
FIG. 3 is a schematic, cross-sectional diagram showing a portion of the high voltage device in accordance with anther embodiment of the invention.

Please refer to FIG. 3. FIG. 3 is a schematic, cross-sectional diagram showing a portion of the high voltage device in accordance with anther embodiment of the invention. According to another embodiment, the outer portion 14b of the isolation structure 14 has a thickness that is smaller than that of the inner portion 14a of the isolation structure 14. In other word, the isolation structure 14 has two different thicknesses. The inner portion 14a that is adjacent to the Schottky diode 100 and the second ion well 12 is thicker, while the outer portion 14b that is adjacent to the second heavily doped region 112 is thinner. According to one embodiment of the invention, the assistant gate 20 is only in direct contact with the outer portion 14b of the isolation structure 14. By providing such configuration, when the high voltage device 1 is operated in reverse mode, the assistant gate 20 can induce more significant carrier coupling effect to the first ion well 11 directly under the outer portion 14b.

Figure 4:
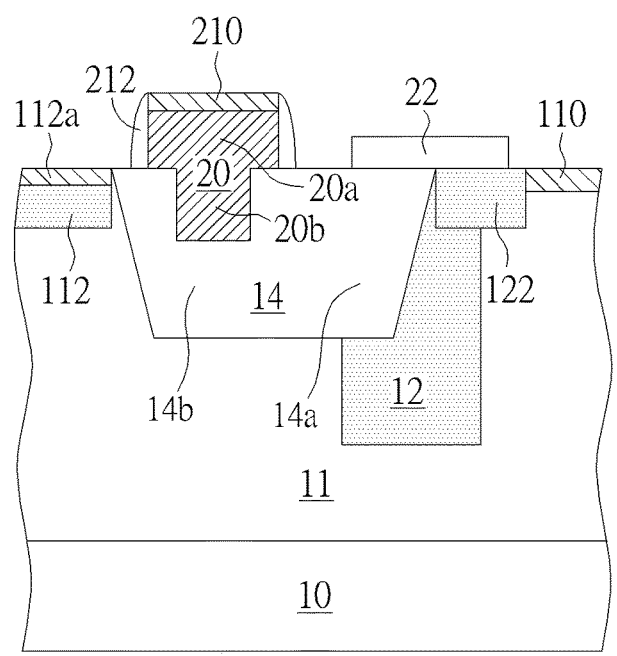
FIG. 4 is a schematic, cross-sectional diagram showing a portion of the high voltage device in accordance with still another embodiment of the invention.

Please refer to FIG. 4. FIG. 4 is a schematic, cross-sectional diagram showing a portion of the high voltage device in accordance with still another embodiment of the invention. According to still another embodiment, the assistant gate 20 may comprise a first portion 20a above a surface of the outer portion 14b of the isolation structure 14, and a second portion 20b embedded or extended into the outer portion 14b of the isolation structure 14. By providing such configuration, when the high voltage device 1 is operated in reverse mode, the assistant gate 20 can induce more significant carrier coupling effect to the first ion well 11 directly under the outer portion 14b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high voltage device, comprising:
a semiconductor substrate having a first conductivity type;
a first ion well having a second conductivity type;
a Schottky diode disposed in the first ion well;

an isolation structure in the first ion well and surrounding the Schottky diode; and an assistant gate disposed only on the isolation structure and surrounding the Schottky diode, wherein the assistant gate is electrically connected to the Schottky diode by the assistant gate connected to a first contact element, the first contact element connected to an interconnection, the interconnection connected to a second contact element, and the second contact element connected to the Schottky diode.

2. The high voltage device according to claim 1, wherein the Schottky diode comprises a silicide layer in direct contact with the first ion well.

3. The high voltage device according to claim 1 further comprising a second ion well having the first conductivity type in the first ion well, wherein the second ion well is disposed along an inner side of the isolation structure and surrounds the Schottky diode, and wherein the second ion well overlaps with an inner portion of the isolation structure, and wherein the second ion well is disposed in between the Schottky diode and the assistant gate.

4. The high voltage device according to claim 3 further comprising a salicide block (SAB) layer disposed on the second ion well and surrounding the Schottky diode, wherein the SAB layer extends to above the inner portion of the isolation structure.

5. The high voltage device according to claim 4 further comprising a first heavily doped region having the first conductivity type and disposed between the Schottky diode and the isolation structure, wherein part of the first heavily doped region is disposed within the second ion well and part of the first heavily doped region is disposed within the first ion well.

6. The high voltage device according to claim 1 further comprising a cathode disposed in the first ion well, wherein the cathode is disposed on an outer side of the isolation structure and surrounds an outer portion of the isolation structure.

7. The high voltage device according to claim 6, wherein the outer portion of the isolation structure has a thickness that is smaller than that of the inner portion of the isolation structure.

8. The high voltage device according to claim 6, wherein the assistant gate is only in direct contact with the outer portion of the isolation structure.

9. The high voltage device according to claim 6, wherein the assistant gate comprises a first portion above a surface of the outer portion of the isolation structure and a second portion embedded into the outer portion of the isolation structure.

10. The high voltage device according to claim 1, wherein the first conductivity type is P type and the second conductivity type is N type.

11. The high voltage device according to claim 1, wherein the assistant gate comprises polysilicon.

12. The high voltage device according to claim 1, wherein the semiconductor substrate comprises a silicon substrate, an epitaxial semiconductor substrate or a silicon-on-insulator (SOI) substrate.

13. The high voltage device according to claim 4, wherein the assistant gate is not in direct contact with the SAB layer.

14. A layout structure of a high voltage device, comprising:
a semiconductor substrate having a first conductivity type;
a first ion well having a second conductivity type;
a Schottky diode disposed in the first ion well;
an annular isolation structure in the first ion well and surrounding the Schottky diode; and
an annular assistant gate disposed only on the annular isolation structure and surrounding the Schottky diode, wherein the annular assistant gate is electrically connected to the Schottky diode.

15. The layout structure of a high voltage device according to claim 14 further comprising an annular second ion well having the first conductivity type in the first ion well, wherein the annular second ion well is disposed along an inner side of the annular isolation structure and surrounds the Schottky diode, wherein the annular second ion well overlaps with an inner portion of the isolation structure.

16. The layout structure of a high voltage device according to claim 15 further comprising an annular salicide block (SAB) layer disposed on the annular second ion well and surrounding the Schottky diode, wherein the annular SAB layer extends to above the inner portion of the isolation structure.

17. The layout structure of a high voltage device according to claim 15, wherein the isolation structure further comprises an outer portion, wherein the annular assistant gate is disposed on the outer portion.

18. The layout structure of a high voltage device according to claim 17, wherein the outer portion of the isolation structure has a thickness that is smaller than that of the inner portion of the isolation structure.

* * * * *